(12) United States Patent
Krutsick

(10) Patent No.: US 7,439,146 B1
(45) Date of Patent: Oct. 21, 2008

(54) FIELD PLATED RESISTOR WITH ENHANCED ROUTING AREA THEREOVER

(75) Inventor: Thomas J. Krutsick, Blandon, PA (US)

(73) Assignee: Agere Systems Inc., Allentown, PA (US)

( * ) Notice: Subject to any disclaimer, the term of this patent is extended or adjusted under 35 U.S.C. 154(b) by 408 days.

(21) Appl. No.: 09/650,604

(22) Filed: Aug. 30, 2000

(51) Int. Cl.
*H01L 21/4763* (2006.01)
(52) U.S. Cl. ............... 438/382; 438/384; 257/758; 257/E21.363; 257/E29.326
(58) Field of Classification Search ........... 257/516, 257/536, 537, 538, 367, 380, 489, 755, 758; 438/382, 384, 643, 653
See application file for complete search history.

(56) References Cited

U.S. PATENT DOCUMENTS

| | | | | |
|---|---|---|---|---|
| 3,683,491 A | * | 8/1972 | Nelson et al. | 438/382 |
| 3,694,719 A | | 9/1972 | Saxena et al. | 317/235 |
| 4,423,433 A | * | 12/1983 | Imaizumi et al. | 257/488 |
| 4,609,935 A | * | 9/1986 | Kondo | 357/51 |
| 4,948,747 A | * | 8/1990 | Pfiester | 437/60 |
| 5,200,733 A | * | 4/1993 | Davis et al. | 338/64 |
| 5,374,844 A | * | 12/1994 | Moyer | 257/582 |
| 5,428,242 A | * | 6/1995 | Furuya et al. | 257/538 |
| 5,804,857 A | * | 9/1998 | Tsuji | 257/346 |
| 5,867,087 A | * | 2/1999 | Wuu et al. | 338/311 |
| 5,886,383 A | | 3/1999 | Kinzer | 257/341 |
| 6,046,491 A | * | 4/2000 | Tamagawa | 257/538 |

(Continued)

FOREIGN PATENT DOCUMENTS

EP 77072 * 4/1983

(Continued)

OTHER PUBLICATIONS

D. Jaume et al., "High-Voltage Planar Devices Using Field Plate and Semi-Resistive Layers" IEEE Transactions on Electron Devices, vol. 38, No. 7, Jul. 1991.*

(Continued)

*Primary Examiner*—Ahmed Sefer

(57) ABSTRACT

An integrated circuit includes a field plated resistor having enhanced area thereover for routing metal conductors, formed in the same layer of metal as forms contacts to the resistor, is fabricated by a sequence of processing steps. A resistor having a resistor body and a contact region at each end thereof is formed in an active region of a semiconductor substrate. A first layer of insulative material is formed over the resistor and a window is created through the first layer of insulative material to the resistor body to form a first contact region. A layer of polysilicon is formed over the first insulative layer to define a field plate, the polysilicon field plate being contiguous with the first contact region of the resistor and extending over the resistor body to substantially to the other contact region, as layout, design, and fabrication rules permit. A second insulative layer is formed over the polysilicon layer. Windows are created in the second insulative layer to provide access to the polysilicon field plate and the second contact region. A metal layer is applied and unwanted metal is etched away to provide conductors over the polysilicon field plate of a field plated resistor having enhanced area thereover for routing metal conductors formed in the same layer of metal as forms contacts to the resistor.

6 Claims, 19 Drawing Sheets

U.S. PATENT DOCUMENTS 6,400,252 B1 * 6/2002 Smith et al. .................. 338/308

FOREIGN PATENT DOCUMENTS

| GB | 2 016 208 | | 9/1979 |
| GB | 2016208 | * | 9/1979 |
| GB | 2 097 581 | * | 11/1982 |
| JP | 56021359 | * | 2/1981 |
| JP | 57-100723 | * | 6/1982 |
| JP | 60-128651 | * | 7/1985 |
| JP | 62-274654 | * | 1/1987 |
| JP | 63-58955 | * | 3/1988 |
| JP | 1-253950 | * | 10/1989 |
| JP | 3-16164 | * | 1/1991 |
| JP | 1-130552 | * | 5/1998 |

OTHER PUBLICATIONS

Patent Abstracts of Japan, vol. 0060, No. 55 (E-101) Apr. 10, 1982.
Patent Abstracts of Japan, vol. 0050, No. 70 (E-056) May 12, 1981.
Patent Abstracts of Japan, vol. 0061, No. 85 (E-132) Sep. 21, 1982.
Patent Abstracts of Japan, vol. 0100, No. 87 (E-393) Apr. 5, 1986.

* cited by examiner

FIELD PLATED RESISTOR WITH ENHANCED ROUTING AREA THEREOVER

TECHNICAL FIELD

This invention relates generally to semiconductor processing technology and more particularly to a field plated resistor to provide maximum routing area over the field plated resistor.

BACKGROUND OF THE INVENTION

Various methods of fabricating resistors on a semiconductor substrate are known. U.S. Pat. Nos. 4,140,817, 5,548,268, 5,683,928, 5,976,392, 5,989,970, 6,069,398, and 6,093,596, each of which is hereby incorporated by reference, discloses a method of manufacturing resistors.

In an integrated circuit, a metal, such as a trace, passing over the body of a high sheet resistance diffused resistor, can cause variations in the resistance of the resistor when a voltage is applied to the trace. The voltage on the trace could cause a region of the resistor beneath the trace to invert, deplete, or accumulate, which would result in resistance variations in the resistor. Through repeated occurrences, undesirably, a permanent change to the resistance could occur.

One solution has been to not route metal conductors over resistors to obviate the problem. This technique, however, wastes valuable area and causes integrated circuit die employing this technique to be larger in area than integrated circuit die utilizing the area over resistors for routing metal conductors.

Another solution, illustrated in FIG. 18, has been to extend over the resistor body the metal trace that connects to a first one of the resistor contacts. The metal extension, known as a field plate, would extend almost to the metal that connects to the second resistor contact, as layout, design, and fabrication rules allow. In this manner, the voltage applied to the first resistor contact will also be applied to the field plate over the resistor body. The second resistor contact is connected to another potential. There remains variation in the resistance of the resistor due to voltages applied to the first contact and field plate, however, at least the voltage is known. A shortcoming of employing a metal field plate is that the area over the resistor body, excluding the contact areas, is not available for routing other metal conductors in the same layer of metal as contacts to the resistor. Of course, metal conductors could be routed over the resistor body in higher layers of metal, as is known in the art.

Yet another solution, illustrated in FIG. 19, has been to provide a polysilicon field plate over the body of the resistor. The metal trace that connects to a first one of the resistor contacts is extended to also contact the polysilicon field plate. Using this technique, a portion of the area over the body of the resistor is available for routing other metal conductors in the same layer of metal as contacts to the resistor. Since the metal that connects to the first one of the resistor contacts makes a second contact with the polysilicon field plate, the area of the contact with the polysilicon field plate, as well as any area near the contact with the polysilicon due to layout, design and fabrication rules, is not available for routing other metal conductors in the same layer of metal as contacts to the resistor.

What is needed is a field plate resistor that permits substantially all of the area over the body of the resistor that layout, design, and fabrication rules permit to be available for routing metal conductors in the same layer of metal as contacts to the resistor.

SUMMARY OF THE INVENTION

In accordance with the invention, an integrated circuit includes a field plated resistor having enhanced area thereover for routing metal conductors, formed in the same layer of metal as forms contacts to the resistor, is fabricated by a sequence of processing steps. A resistor having a resistor body and a contact region at each end thereof is formed in an active region of a semiconductor substrate. A first layer of insulative material is formed over the resistor and a window is created through the first layer of insulative material to the resistor body to form a first contact region. A layer of polysilicon is formed over the first insulative layer to define a field plate, the polysilicon field plate being contiguous with the first contact region of the resistor and extending over the resistor body to substantially to the other contact region, as layout, design, and fabrication rules permit. A second insulative layer is formed over the polysilicon layer. Windows are created in the second insulative layer to provide access to the polysilicon field plate and the second contact region. A metal layer is applied and unwanted metal is etched away to provide conductors over the polysilicon field plate of a field plated resistor having enhanced area thereover for routing metal conductors formed in the same layer of metal as forms contacts to the resistor.

DETAILED DESCRIPTION

FIGS. 1-16 are a sequence of sectional views through a wafer or semiconductor substrate 20 illustrating steps in the method of fabricating a field plated resistor with area thereover for routing metal conductors formed in the same layer of metal as contacts to the resistor are formed. The semiconductor substrate in a preferred embodiment is silicon, but the invention is not limited thereto. Other known semiconductor substrates may be used. While fabrication of a p-type silicon resistor is illustrated, the invention is not limited thereto. Although the method disclosed herein illustrates fabrication of a field plated resistor fabricated in the semiconductor substrate with metal contacts fabricated in the first layer of metal, the invention can be used to fabricate field plated resistors with metal contacts fabricated in higher layers of metal.

Figure 1:
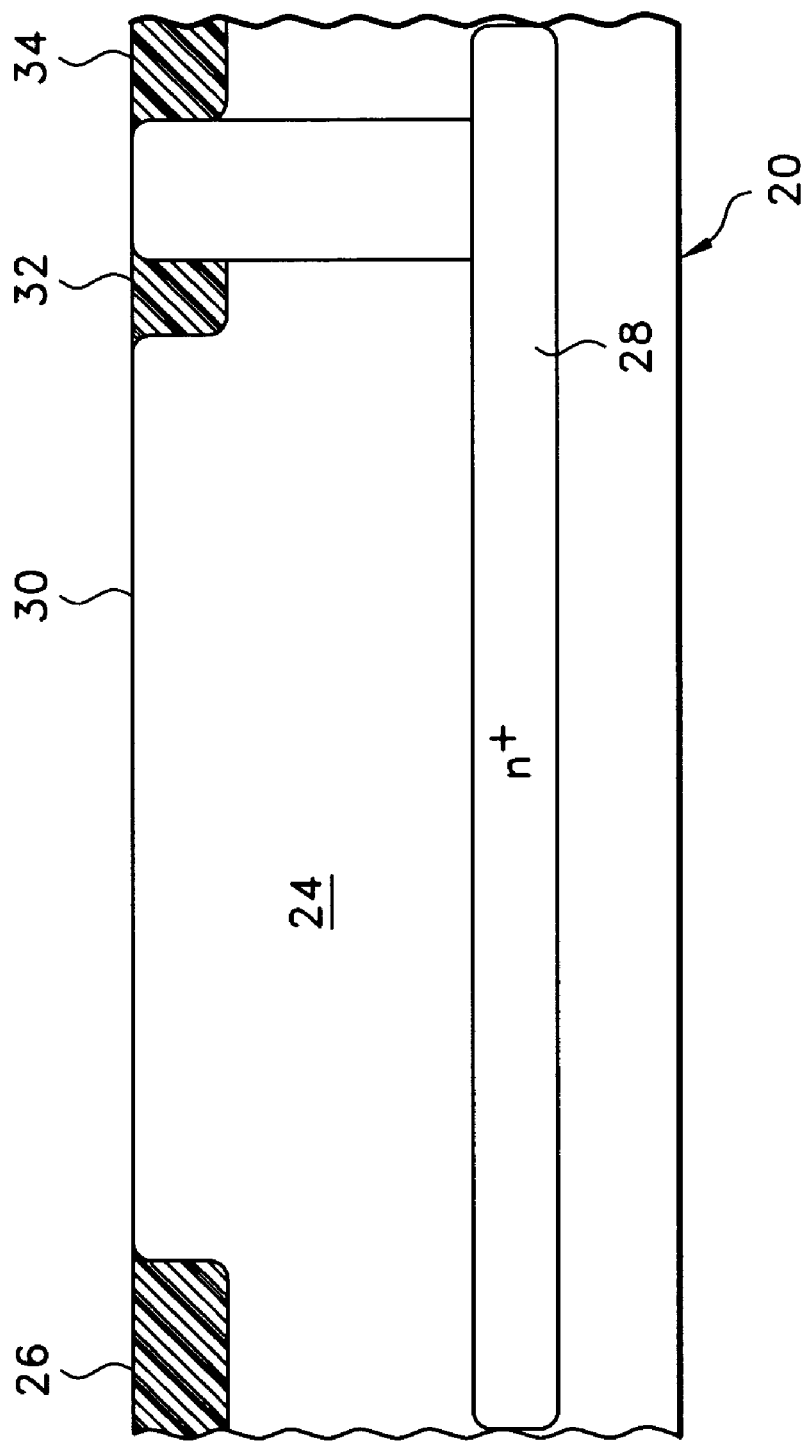
FIGS. 1 through 16 are a sequence of sectional views through a semiconductor substrate illustrating steps in the method for fabricating an integrated circuit including a field plated resistor with enhanced routing area thereover, in accordance with the present invention.

As shown in FIG. 1, a tub or active area in which the field plated resistor will be fabricated is developed in semiconductor substrate 20. An n+ implant step over the active area 24, followed by growth of an epitaxial layer of silicon approximately one micron thick, such as by a chemical vapor deposition process, results in a buried n+ layer 28 beneath the resulting upper surface 30 of substrate 20. The size and shape of active area 24 is dependent on the size of the field plated resistor(s) to be fabricated therein as well as the number of devices including field plated resistors contained therein.

The blanket etch step removes oxide (not shown) from upper surface 30 of substrate 20 to provide access to active area 24. Recesses 26, 32, and 34 are etched into the upper surface 30 of substrate 20 such as by a plasma etch process. An n+ implant into the deep collector is made top form contact 36 within the active area 24 but outside the resistor. Contact 36 provides electrical access to the buried n layer 28 from upper surface 30. Field oxide is grown in the trenches for isolation, by any known process such as a recessed poly-buffered LOCOS process. Simultaneous with growing the oxide, the n+ implant is diffused.

Figure 2:
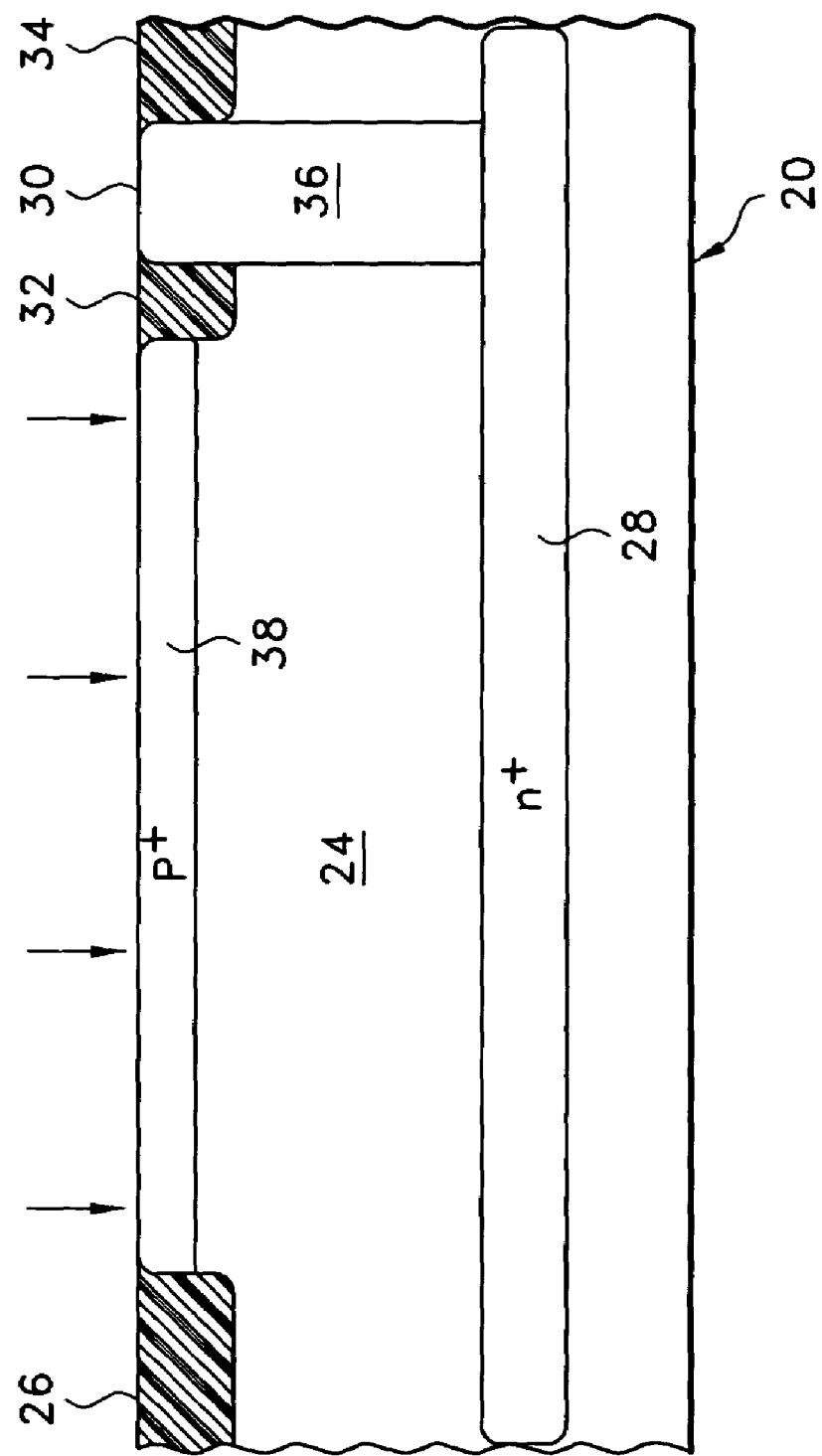

As illustrated in FIG. 2, a mask of photoresist (not shown) is patterned over those portions of surface 30 where an implant is not desired. Portions of the active area 24 are implanted with a p+ dopant, such as but not limited to boron, to form resistor body 38. The amount of p− dopant implanted is determined by the resistance desired, as is known in the art. The photoresist is then removed.

Figure 3:
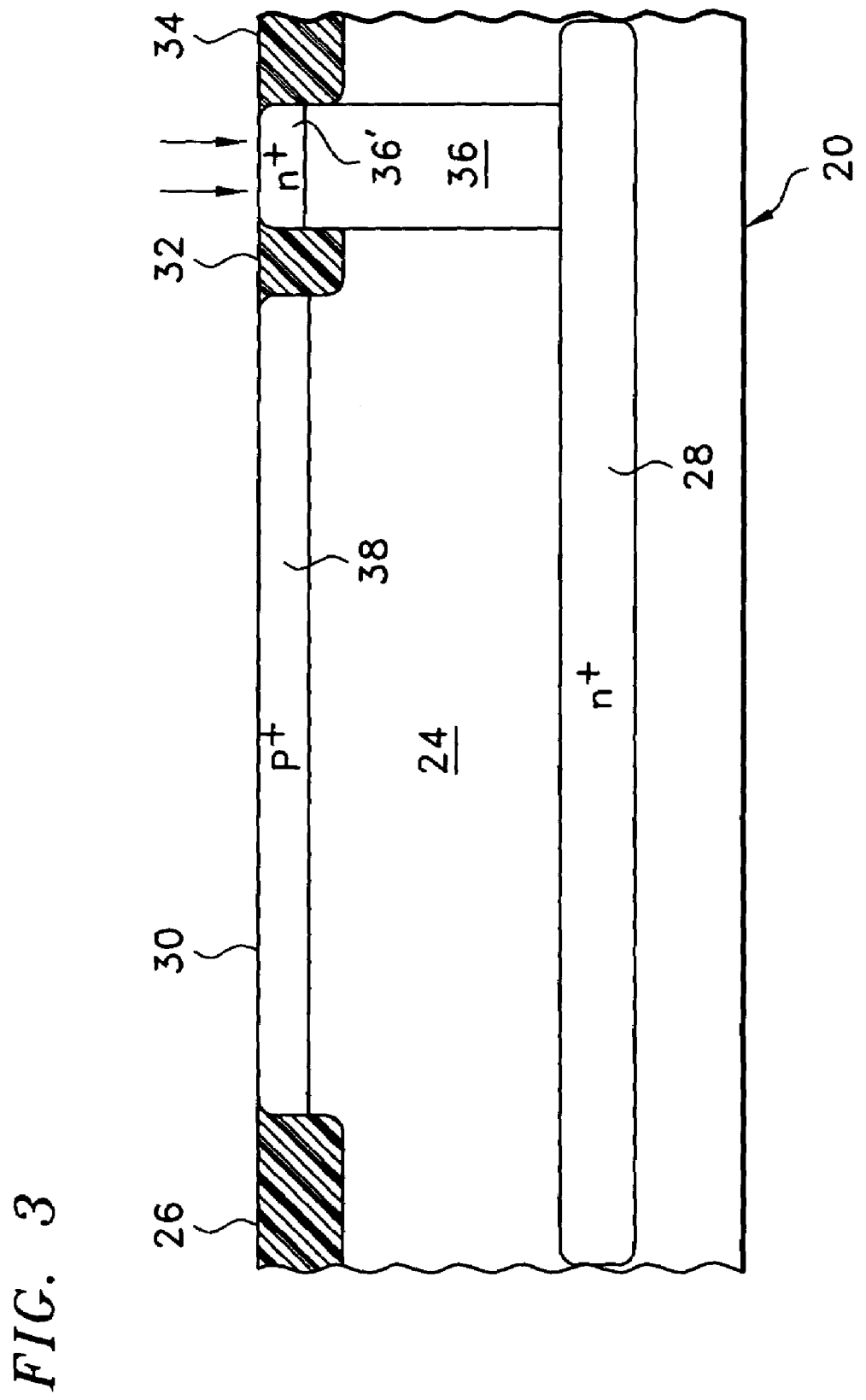

Another photoresist layer (not shown) is patterned over surface 30 where an n+ contact enhancement implant is not desired. The n+ contact enhancement implant, as illustrated in FIG. 3, forms contact region 36' within contact 36. Contact region 36' is of lower resistance than contact 36 due to the n+ implant. The photoresist layer is subsequently removed. Hereinafter, the depositing, patterning and removal of photoresist or masks will not always be discussed. One skilled in the art would know of the necessity of such steps.

Figure 4:
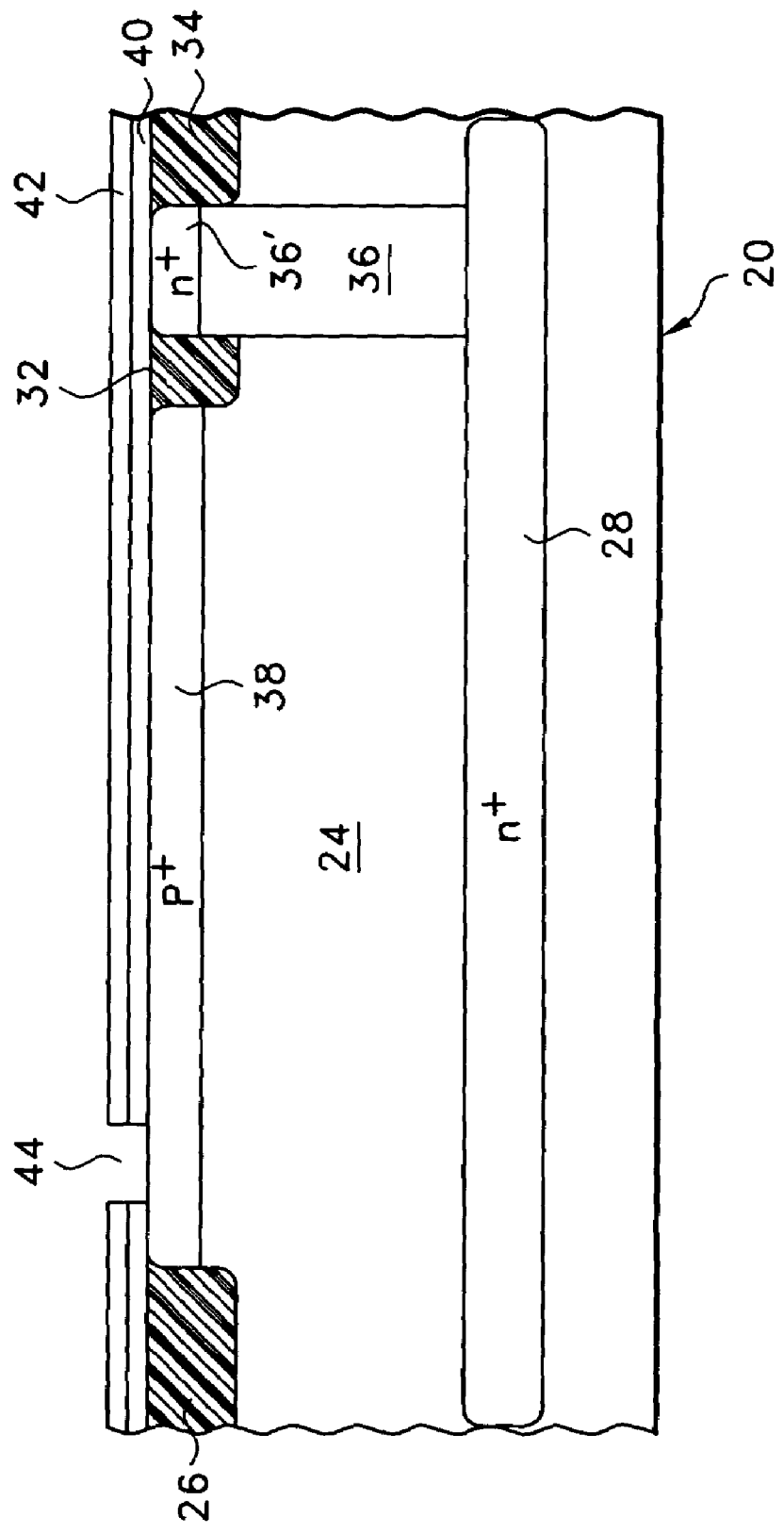

A polysilicon preparation step deposits a layer of insulative material such as TEOS oxide over surface 30 of the entire substrate 20. Oxide layer 40, as shown in FIG. 4, is typically 350 angstroms thick. A layer 42 of amorphous polycrystalline silicon having a thickness of approximately 600 angstroms may be deposited by a chemical vapor deposition process over oxide layer 40. A mask is patterned over layer 42 and an emitter window 44 is etched by a plasma etch process through amorphous polycrystalline silicon layer 42 and oxide layer 40 to the silicon of resistor body 38 in preparation of making contact as first contact 46 with resistor body 38.

Figure 5:
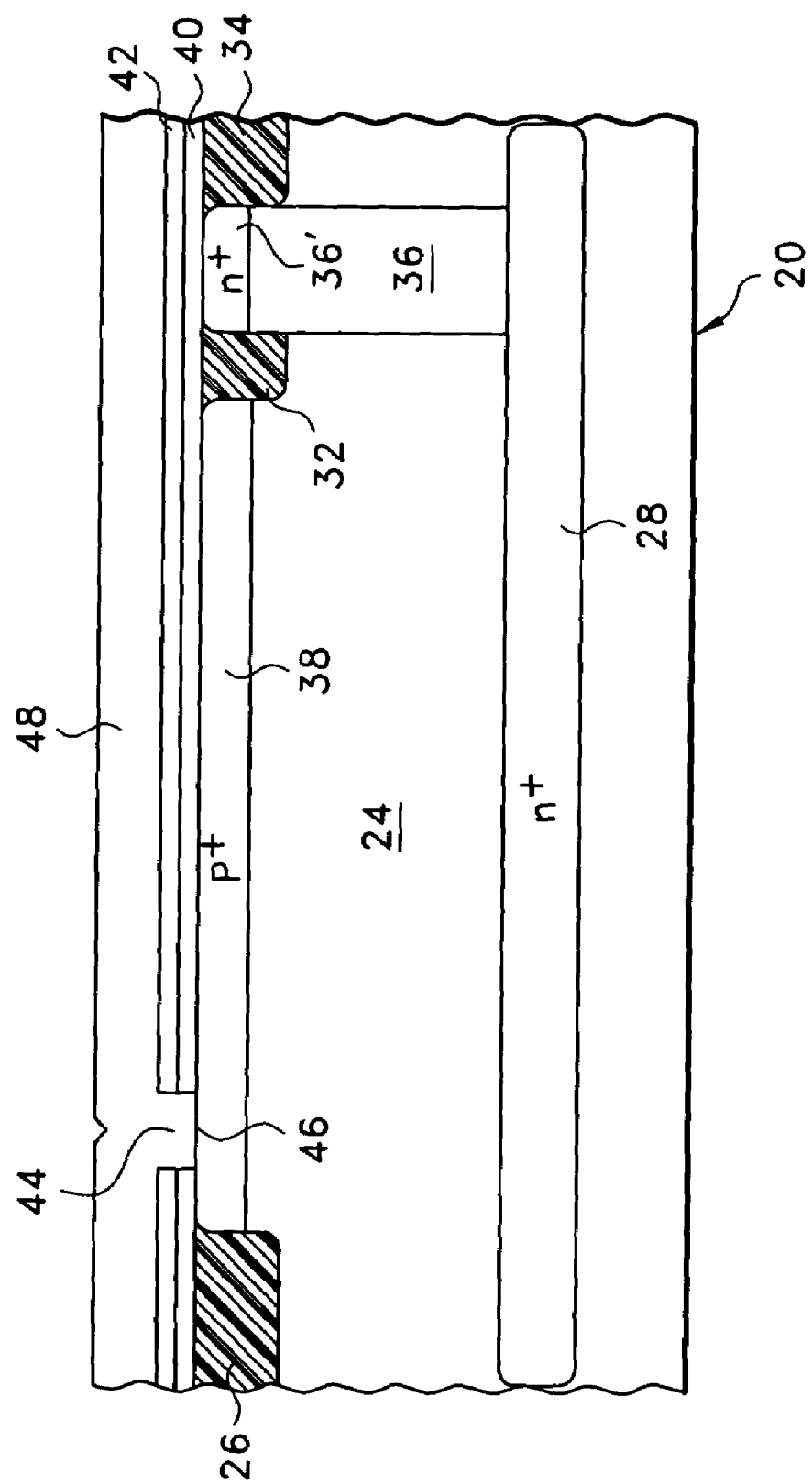
Figure 6:
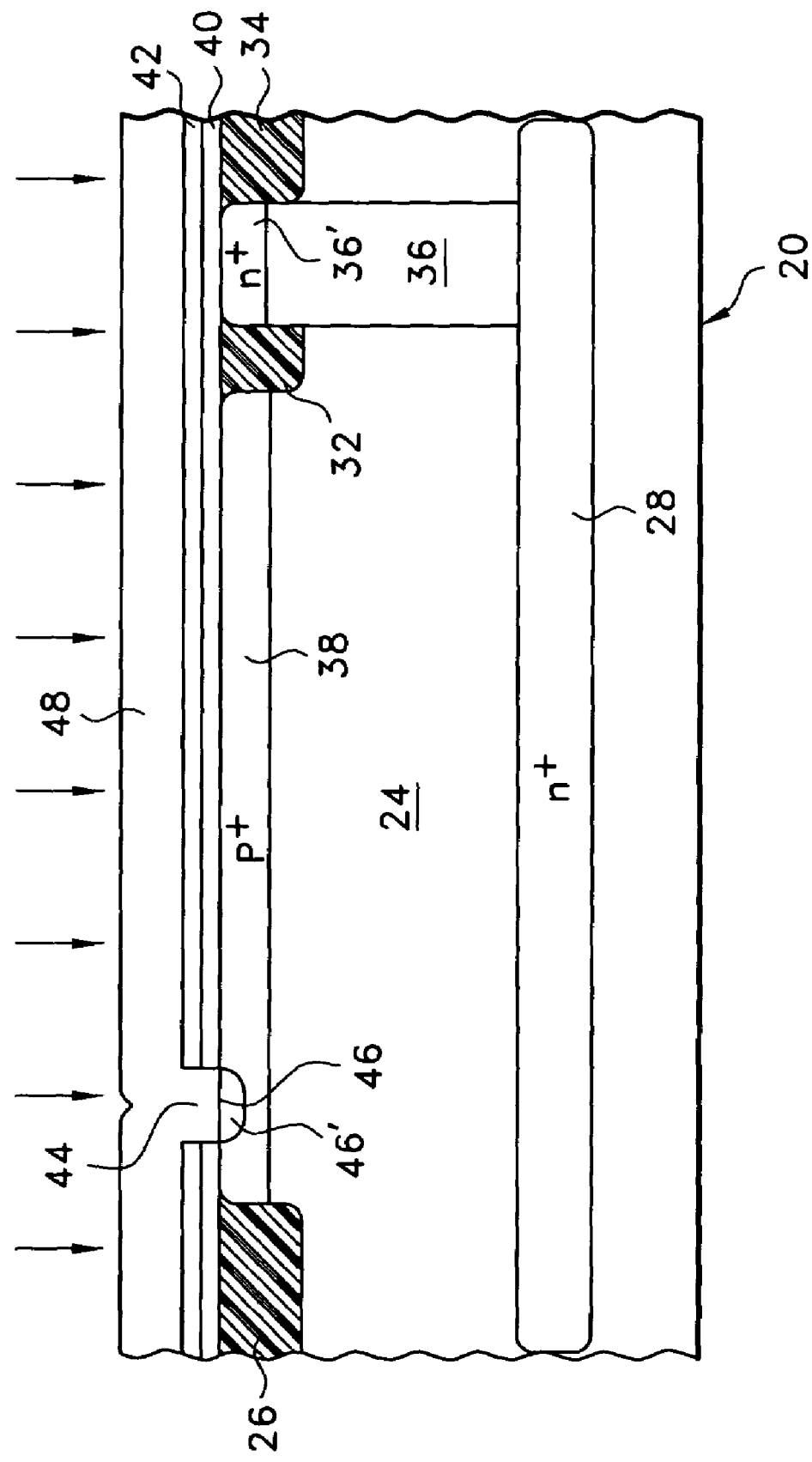

FIG. 5 is a cross sectional view of substrate 20 following a blanket deposition of a layer 48 of polysilicon, typically 3100 angstroms thick, over the amorphous polycrystalline silicon layer 42 by a chemical vapor deposition process. In addition to forming a layer over the amorphous polycrystalline silicon, the layer 48 of polysilicon fills window 44 making contact with resistor body 38 and defining a first resistor contact 46. As part of a doped emitter process, layer 48 of polysilicon is implanted as shown in FIG. 6 with a p-type dopant, such as but not limited to boron, to form a p-doped polysilicon. Doping the polysilicon could be achieved by other known methods. The implanting step is not required by the invention, but contributes to the field plated resistor being fabricated in an existing process without adding additional processing steps. The p-type dopant forms an enhanced contact region 46' in contact 46. Enhanced contact region 46' is of lower resistance than contact 46.

Figure 7:
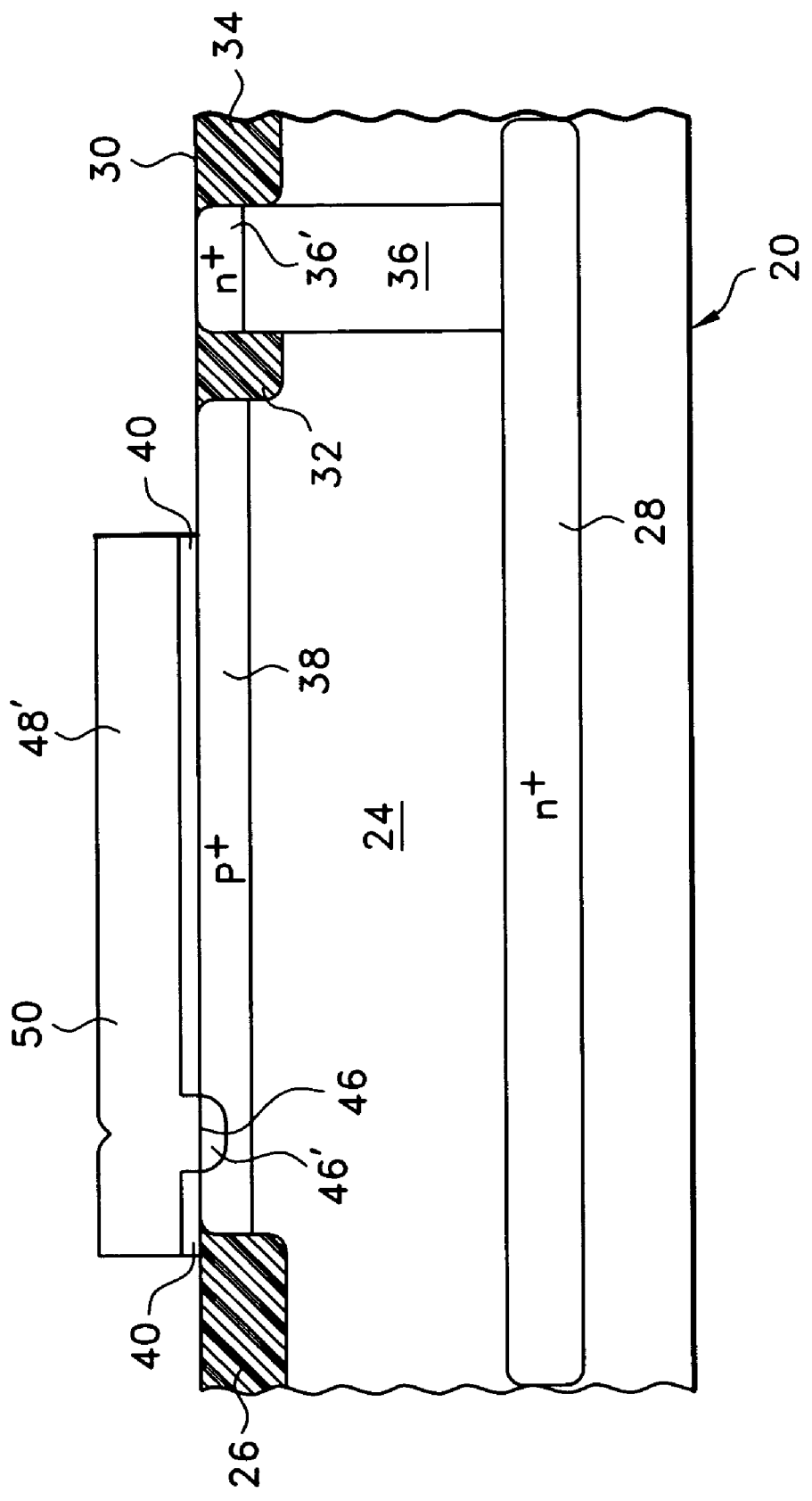

Subsequent to being implanted, layer 48 of polysilicon is hard masked, then etched by a plasma etch process. When layer 48 of polysilicon is etched, not only are unwanted areas of polysilicon layer 48 removed, but also unwanted areas of the amorphous polycrystalline silicon layer 42 and TEOS layer 40 are etched away. The remaining polysilicon, which forms field plate 50, is shown in FIG. 7. The remaining portion of layer 48 of polysilicon extends over substantially all of resistor body 38. The doped polysilicon of field plate 50 provides an electrical path to resistor body 38 through the doped polysilicon in window 44 and enhanced contact region 46'. During a heat treatment step, the amorphous polycrystalline silicon layer 42 is turned into and merged with layer 48 of polysilicon forming polysilicon layer 48'. Polysilicon 48' extends over substantially all of resistor body 38, spaced therefrom by oxide layer 40. Due to layout, design, and fabrication rules, polysilicon layer 48' is etched away from the area (on the right side of FIG. 7) where another window will be formed.

Figure 8:
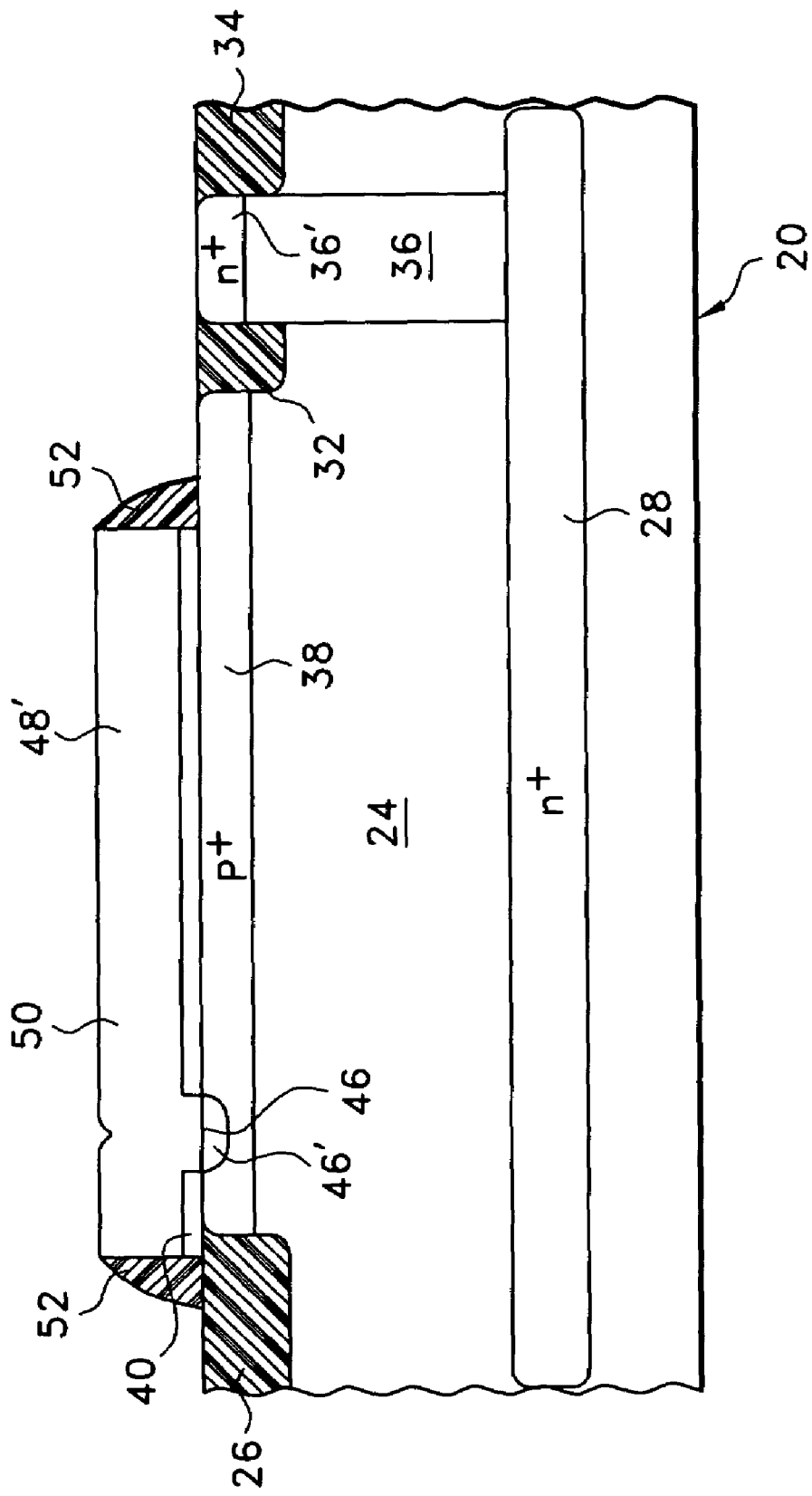

Another step not required by the invention but present in the existing process forms spacer 52 around the periphery of the polysilicon structures of emitter contacts (not shown) and field plate 50 formed from polysilicon layer 48 or 48'. A layer of insulative material such as TEOS oxide is deposited over the entire substrate 20. A dry etch process removes the unwanted insulative material, leaving spacer 52, as shown in FIG. 8, around the periphery of polysilicon structures. Spacer 52 is typically 1500 angstroms in width at surface 30. In the existing process, spacer 52 is placed around the periphery of polysilicon structures to accommodate metal oxide semiconductove devices or self aligned devices fabricated on the same substrate. Spacer 52 self-aligns the second resistor contact 58 and allows greater utilization of the area over the resistor body 38. While not necessary for the invention, this step contributes to fabricating field plated resistors in an existing process without changing or adding process steps.

Figure 9:
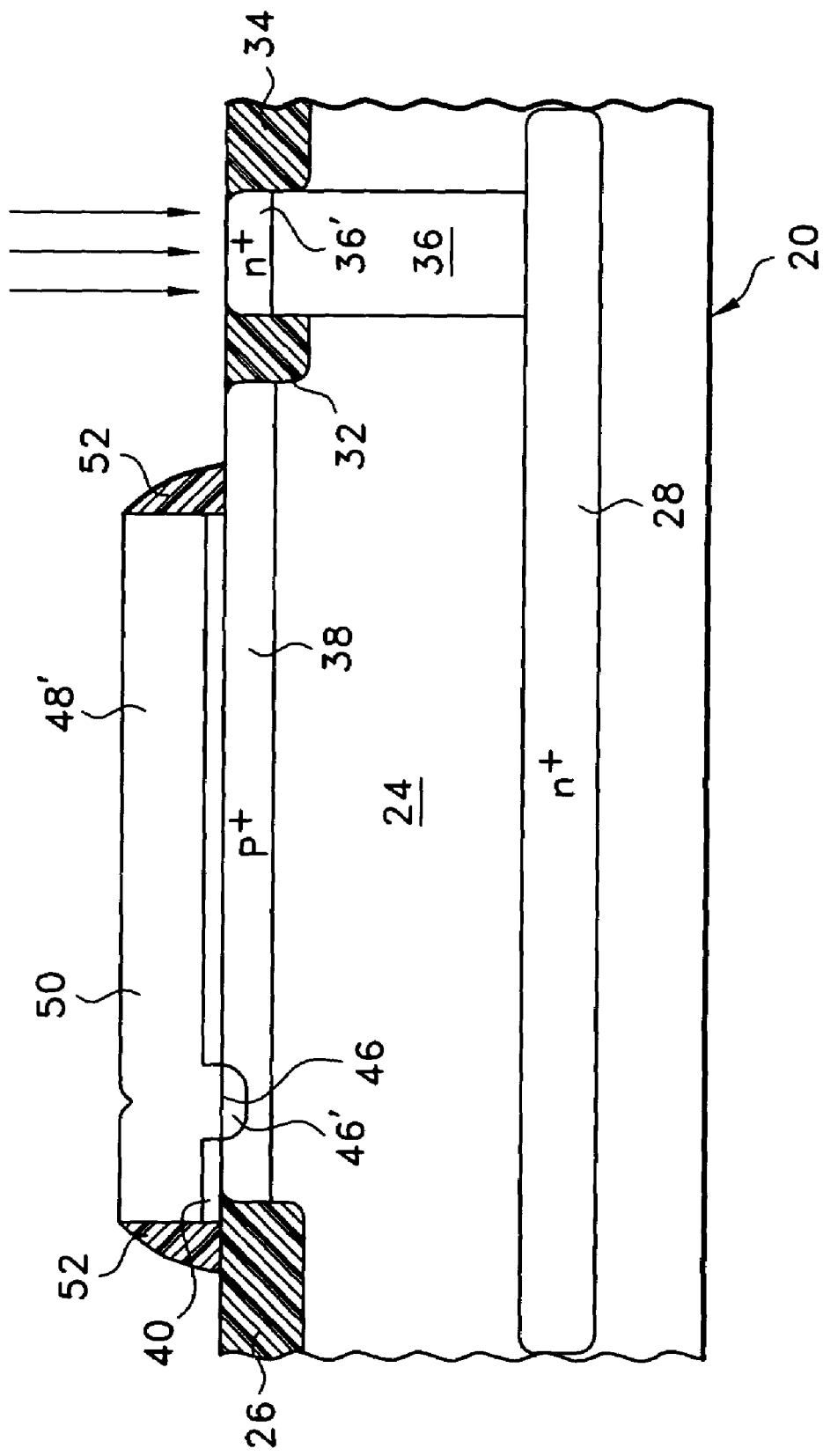

A surface implant step, illustrated in FIG. 9, implants enhanced contact region 36' of the collector contact 36 with an n-type dopant, such as but not limited to arsenic or phosphorus. The implant lowers the resistance of enhanced contact region 36' and collector contact 36. A mask (not shown) is applied to limit the implant to the n tub collector contact, resulting in a n+ deep collector contact that extends down to the buried layer 28.

Figure 10:
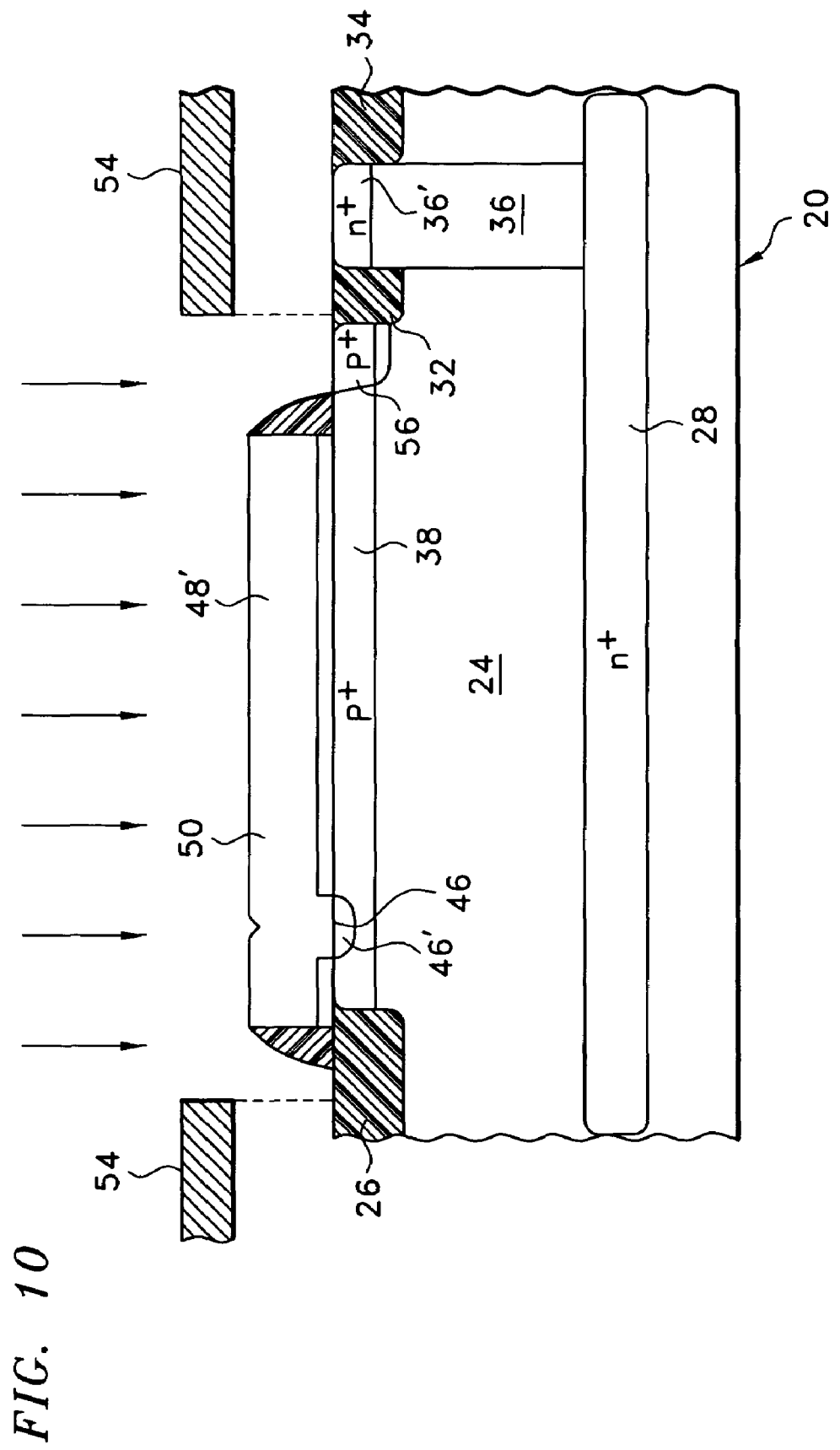

Yet another step not required by the invention, but present in the existing process, is a base enhancement implant illustrated in FIG. 10. In the base enhancement implant, the polysilicon structures of emitter contacts (not shown) and field plate 50 are again implanted with a p-type dopant, such as but not limited to boron, to reduce the resistance thereof. A photoresist mask illustrated as 54 masks regions where the implant is to be prevented. More importantly, a self-aligned p+ implant is achieve in region 56 in resistor body 38 where a second resistor contact 58 will be formed.

Figure 11:
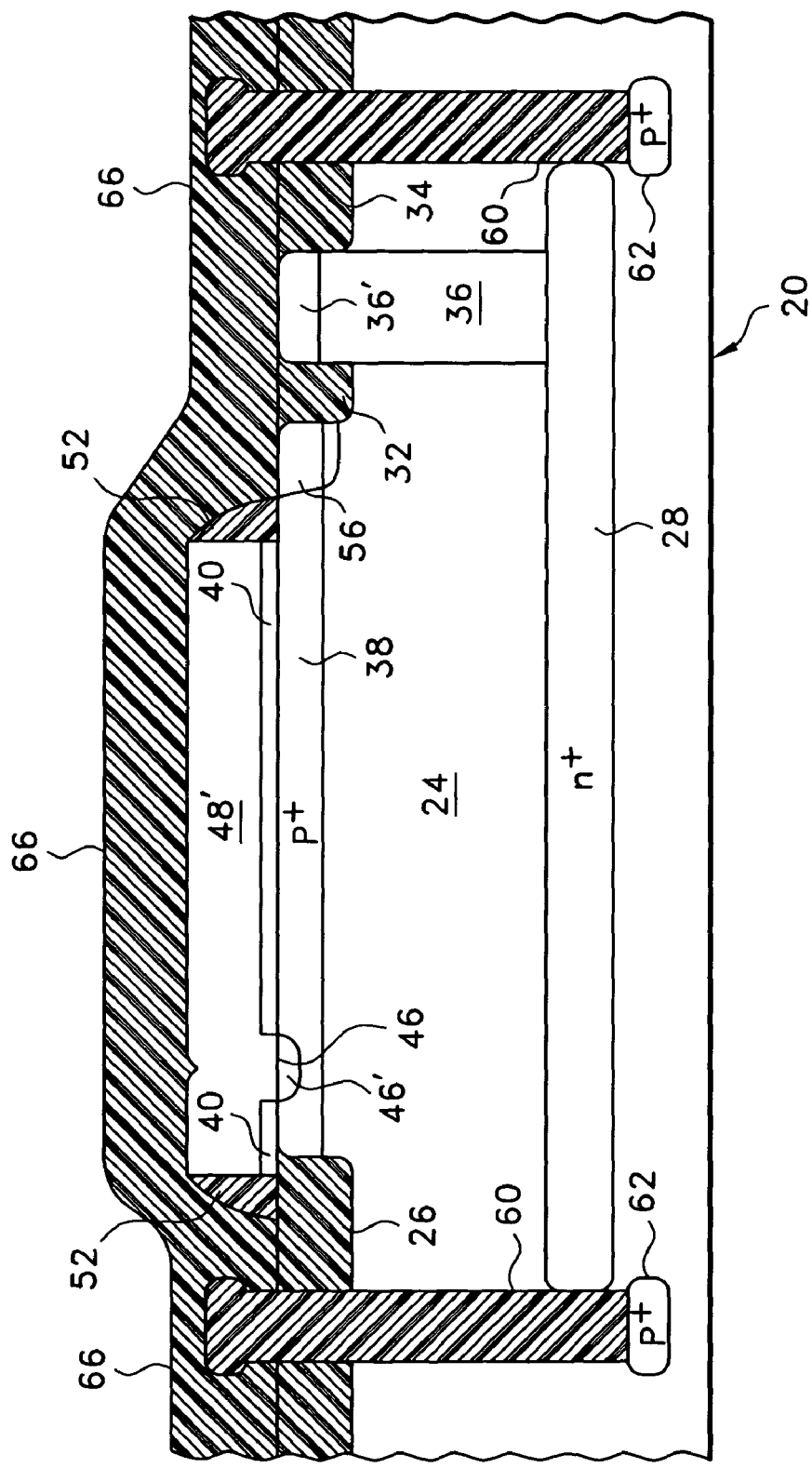

As is known in the art, a trench 60 is formed around active area 24 for isolation of electrical and thermal noise. The steps are not illustrated but the final trench 60 is shown in FIG. 11. In forming trench 60, a mask is formed and the trench is etched, such as by a plasma etch process. A p+ implant forms an implant region 62 at the bottom of trench 60. A sidewall oxide is applied to the trench and the trench is filled with polysilicon. Heat treatment causes the implanted dopant to diffuse into resistor body 38 beneath window 44 forming contact 46'.

As illustrated in FIG. 11, a planarization step applies one or more layers of insulative material such as oxide, collectively illustrated as dielectric layer 66. In a preferred embodiment, a layer of TEOS, a layer of plasma enhanced TEOS, and a layer of boron-phosphorus TEOS are applied. Layer 66 is reflowed in a heat treatment step to smooth the upper surface thereof.

Figure 12:
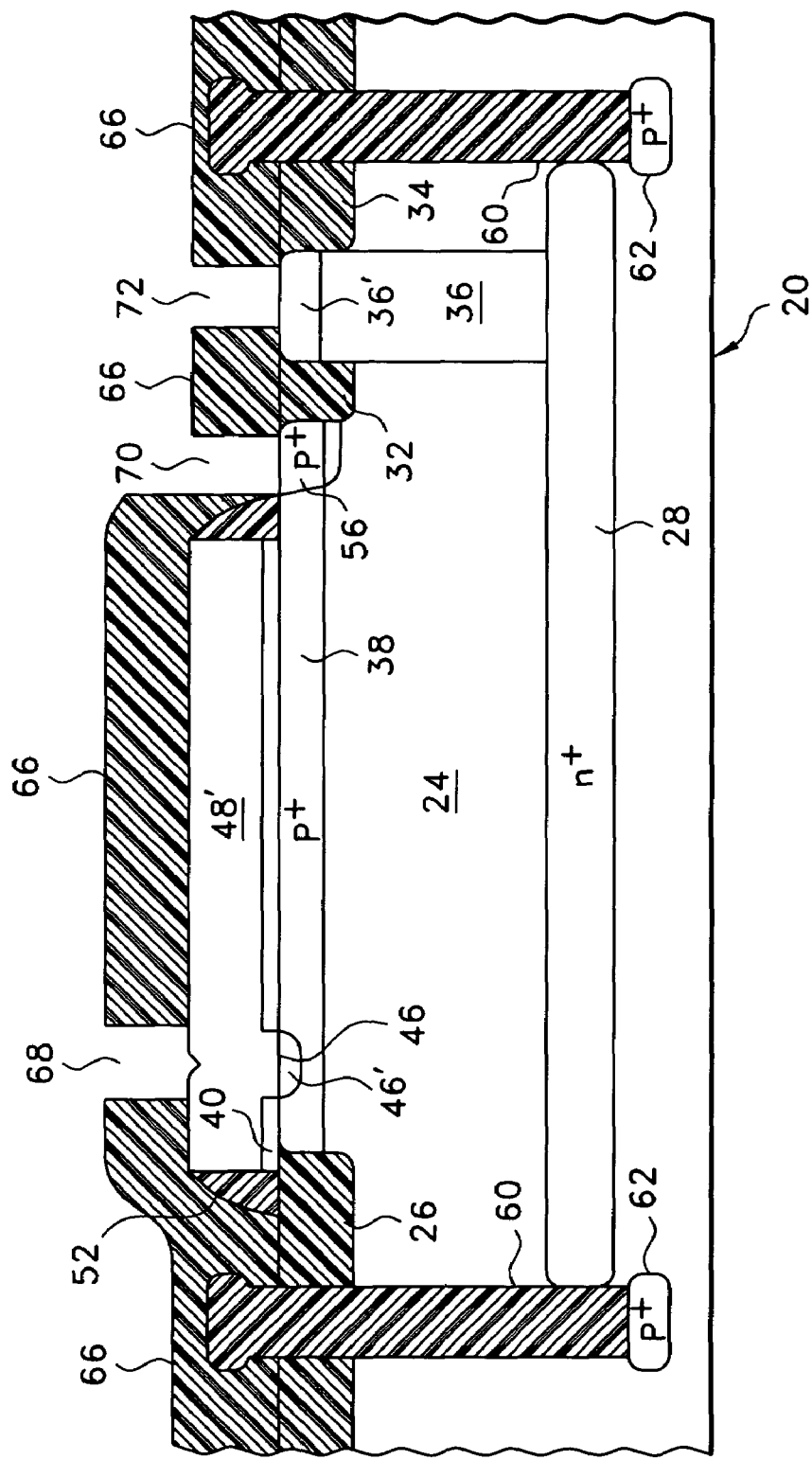

Dielectric layer 66 is masked and etched, such as but not limited to dry etching process to open windows 68, 70, and 72, as shown in FIG. 12. Window 68 opens to polysilicon field plate 50. Window 70 opens to p+ region 56. Window 72 opens to the collector contact 36.

Figure 13:
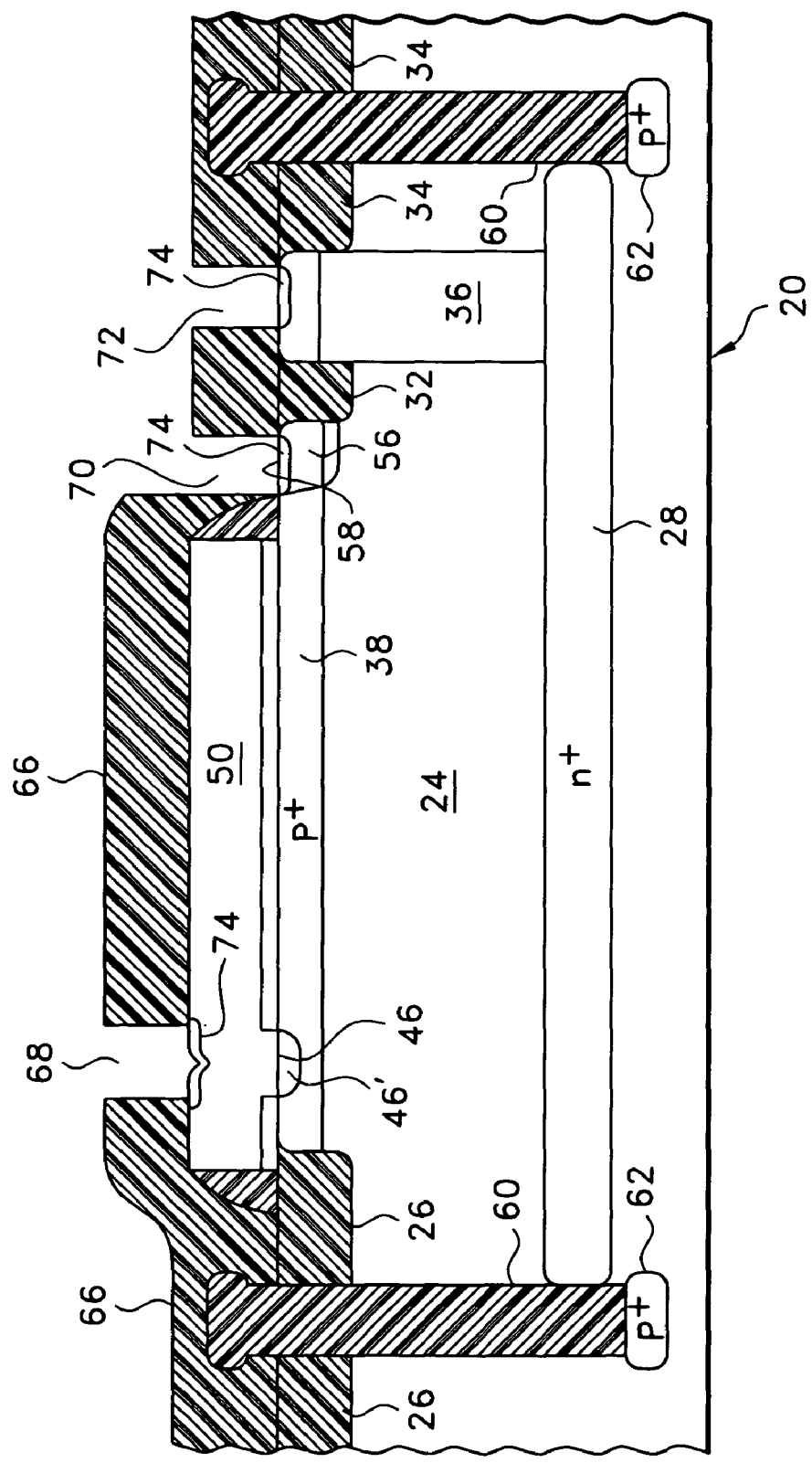

As illustrated in FIG. 13, a first barrier layer 74, such as but not limited to platinum silicide, may be formed in each of windows 68, 70, and 72. Platinum is deposited over the substrate and heated to react with silicon where in contact therewith. Unreacted platinum is etched away, as is known in the art. First barrier 74 in window 68 is formed in field plate 50. First barrier layer 74 in window 70 is formed in the doped silicon in region 56 forming a second contact to resistor body 38. First barrier layer 74 in window 72 is formed in the n+ doped silicon of contact 36.

Figure 14:
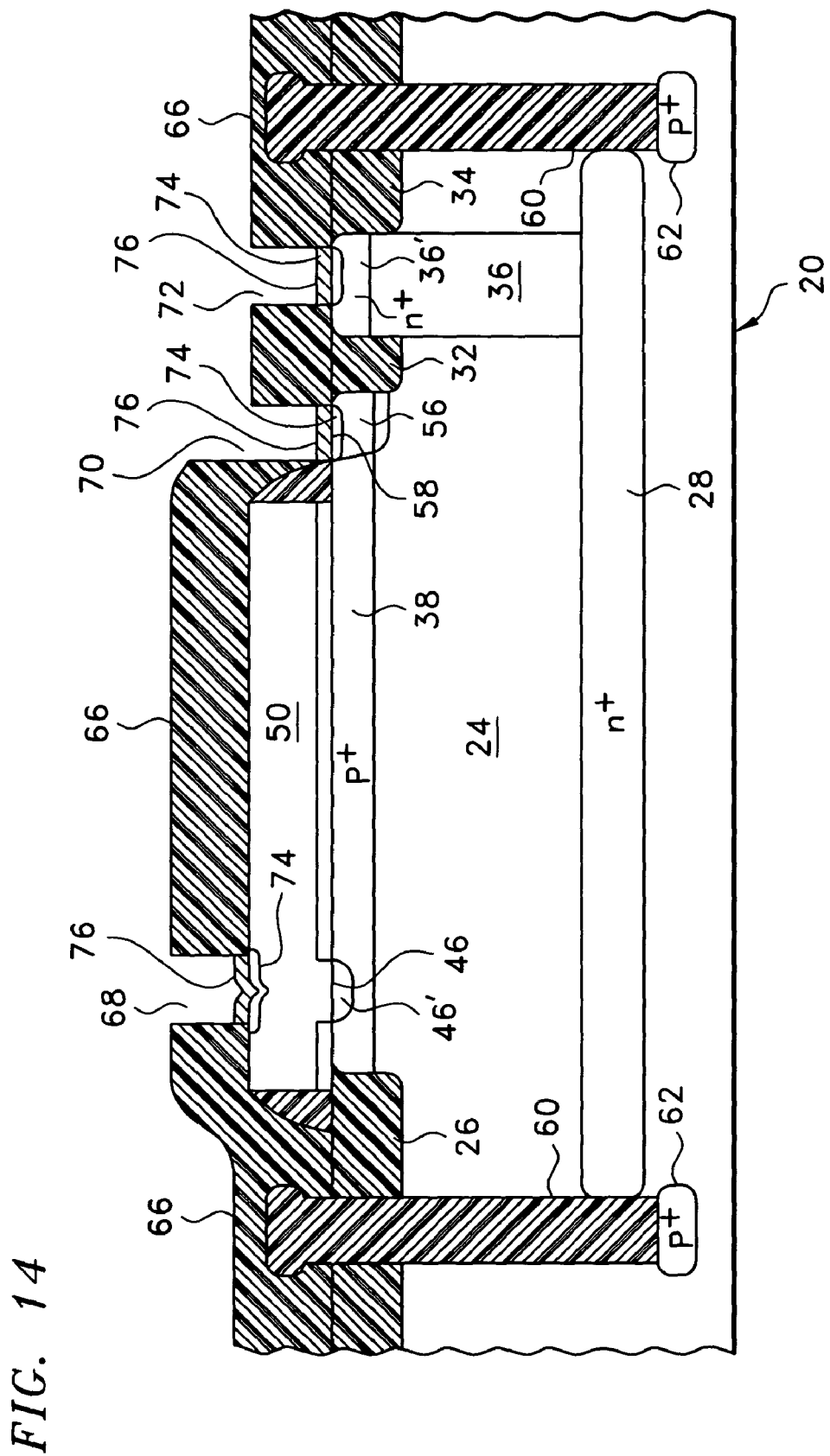

As illustrated in FIG. 14, a second barrier layer 76, such as but not limited to tungsten, is deposited over the first barrier layer 74. The second barrier layer 76, when tungsten may be applied such as but not limited to being by a sputtering process, as is known in the art. Additional or fewer barrier layers may be employed.

Figure 15:
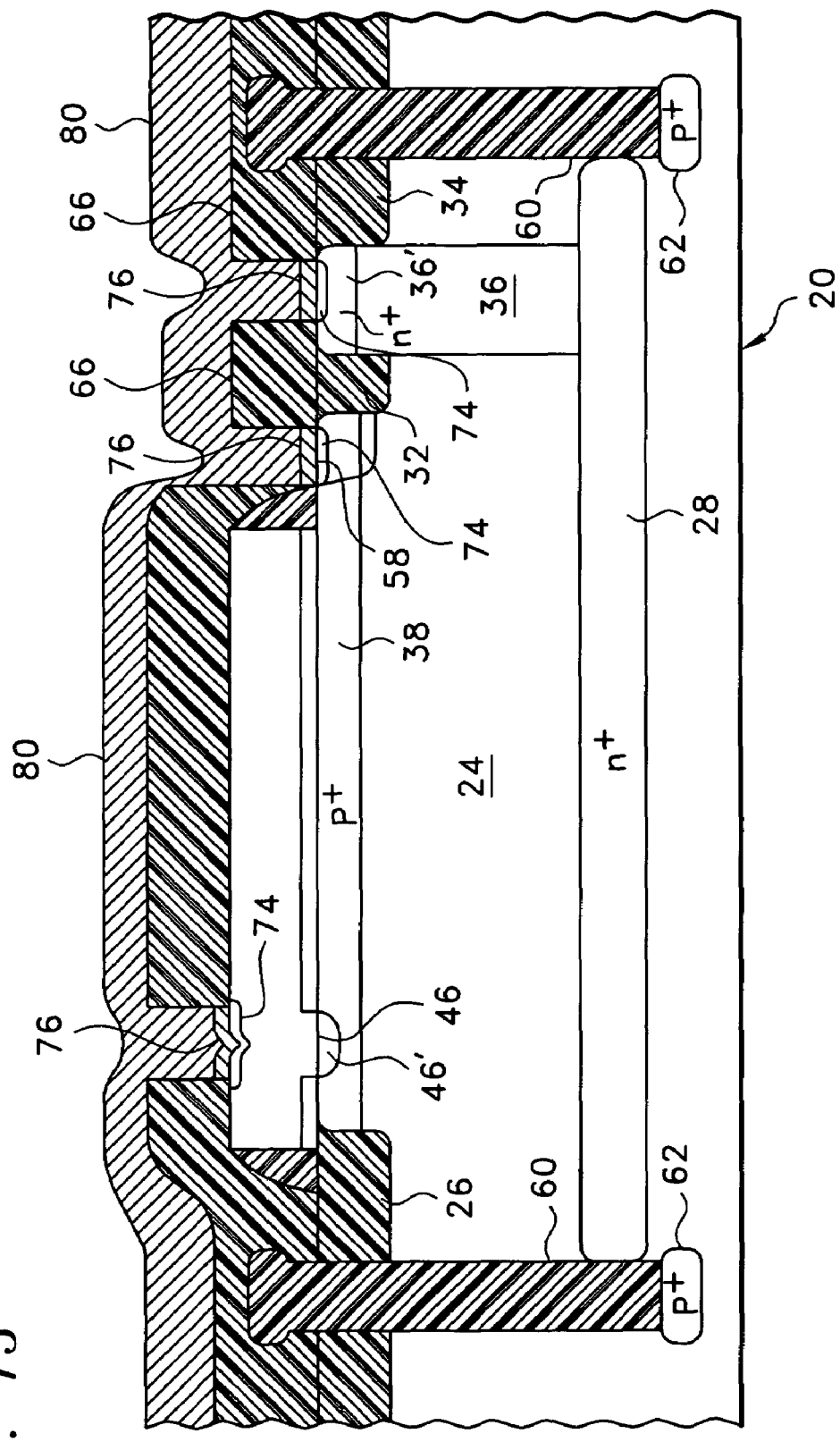

In preparation of forming conductors or traces, a layer of metal 80, such as but not limited to aluminum or copper, is deposited as illustrated in FIG. 15 over the entire uppermost surface, as is known in the art. In the embodiment illustrated in FIG. 15 layer 80 of metal is the first layer of metal, however, the invention is not limited thereto. The invention can be used at any level of metal in a multiple metal level process for fabricating integrated circuits.

Figure 16:
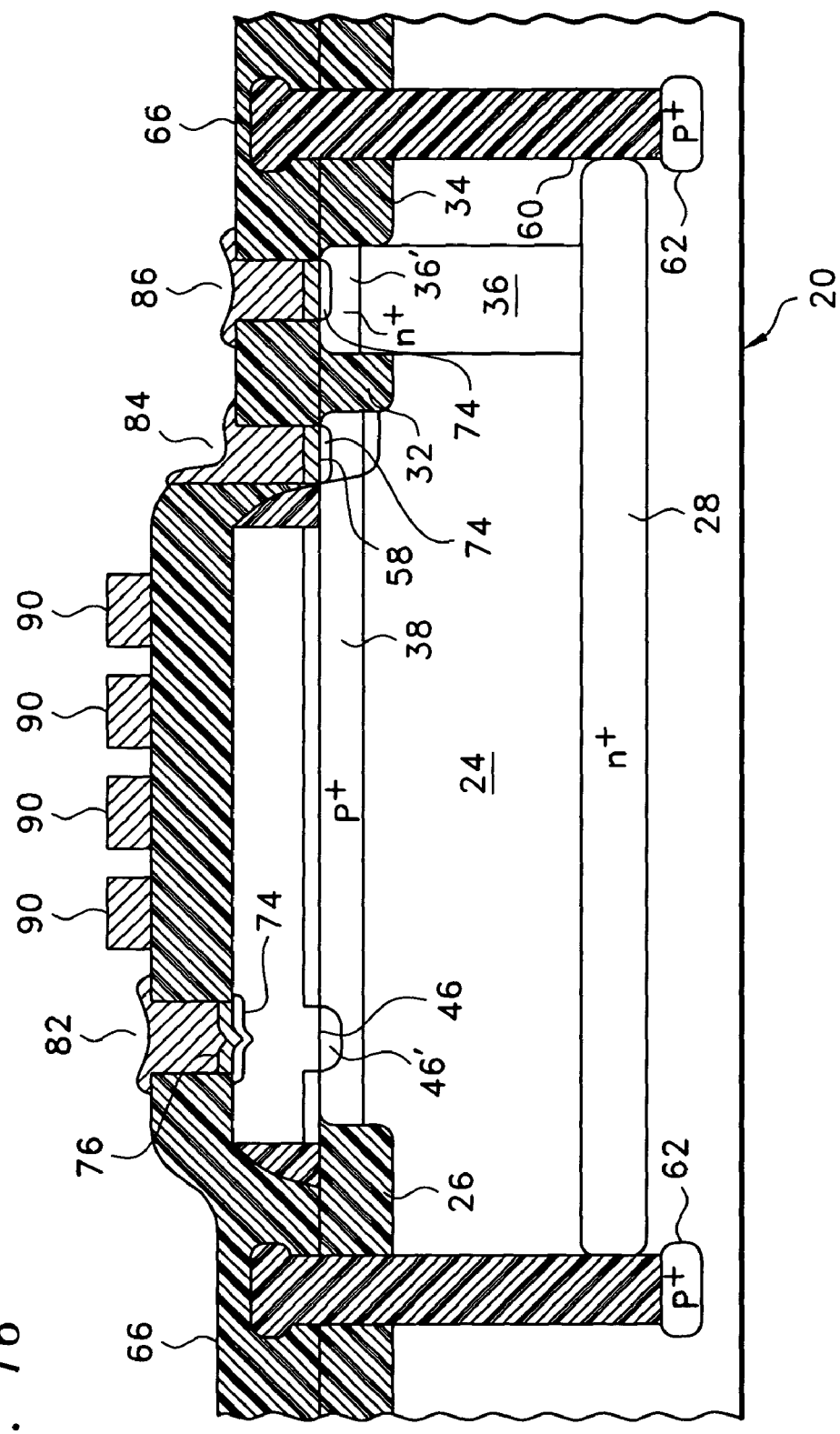
Figure 17:
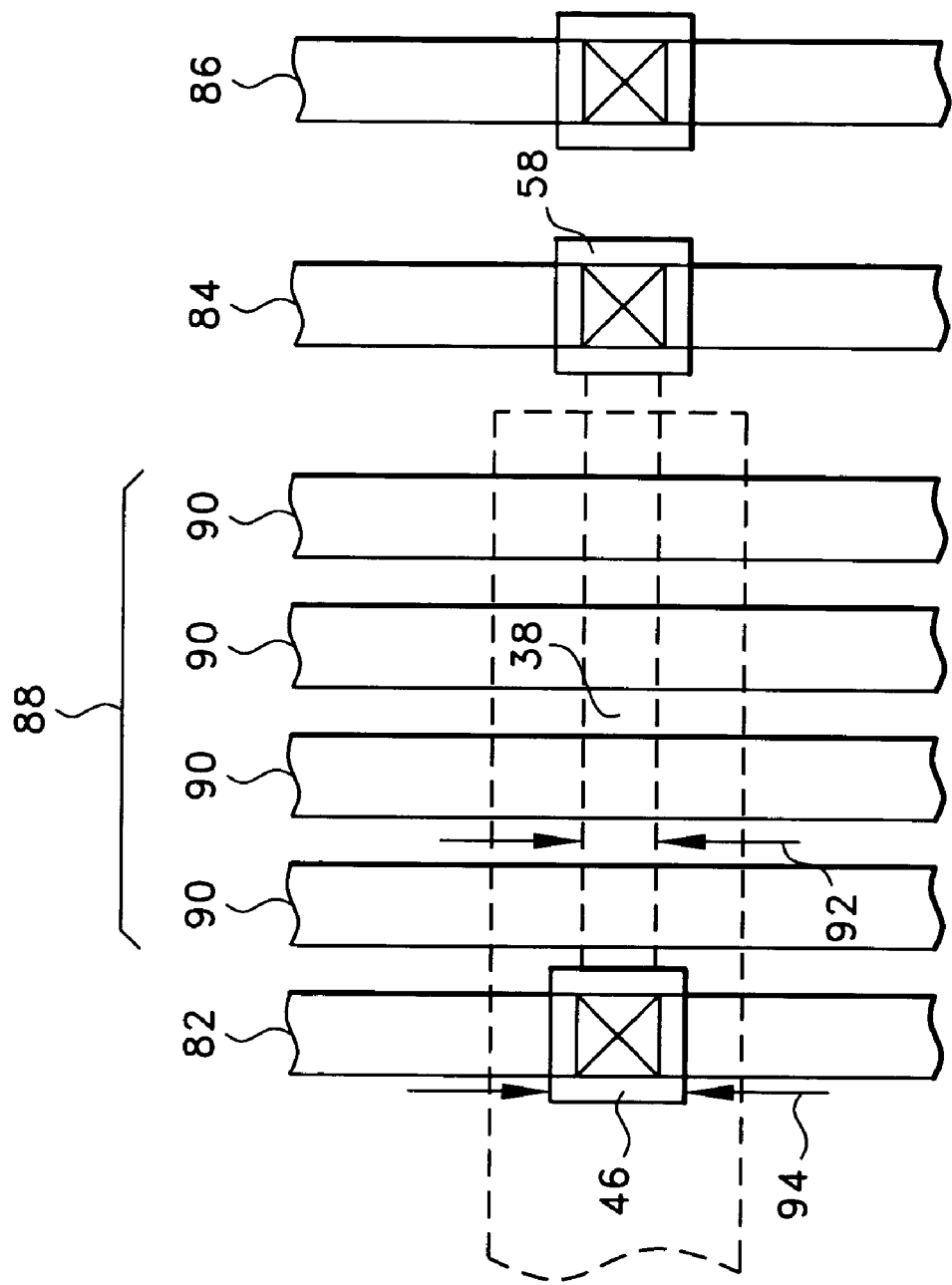
FIG. 17 is a top view of the field plated resistor with enhanced routing area thereover of FIG. 16, illustrating one possible routing of traces over the resistor.
Figure 18:
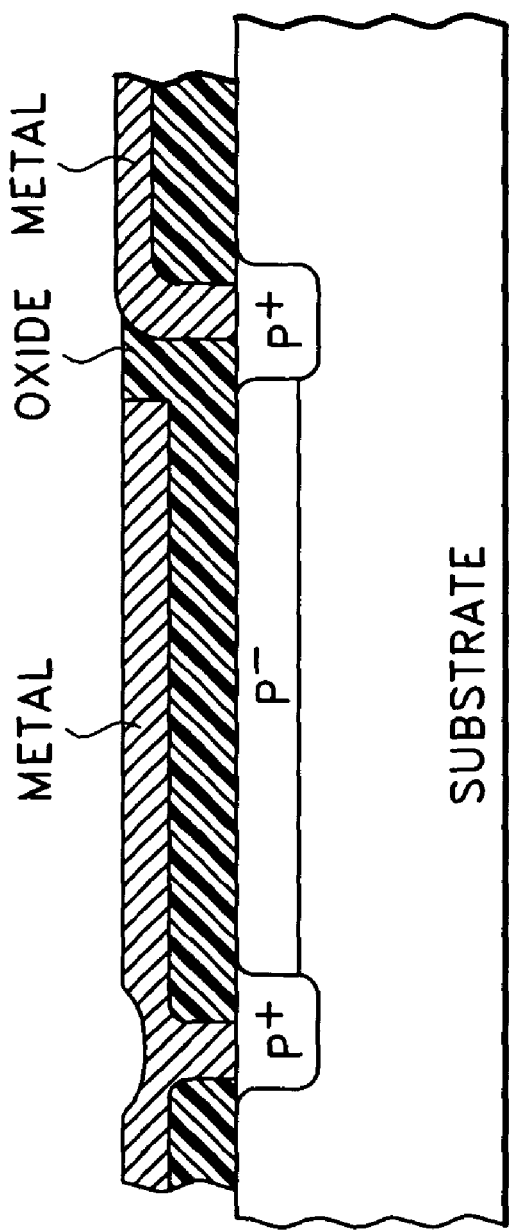
FIG. 18 is a sectional view of a prior art resistor having a metal field plate.
Figure 19:
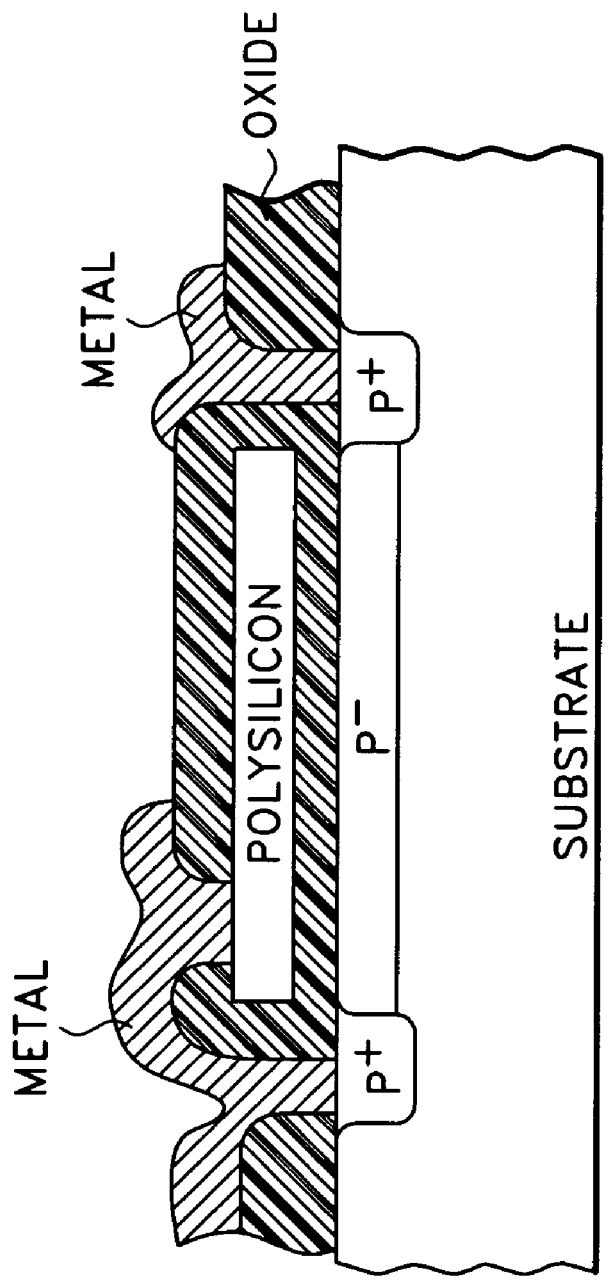
FIG. 19 is a sectional view of a prior art resistor having a polysilicon field plate.

Unwanted metal in layer 80 is etched away as known in the art, resulting in the field plated resistor having traces extending thereover illustrated in FIGS. 16 and 17. Metal layer 80 provides a lead 82 to emitters (not shown) and field plate 50, a lead 84 to second resistor contact 58, a lead 86 to contact 36, and traces 88 of which traces 90 that are routed over resistor body 38 are a subset. The field plated resistor illustrated in FIG. 15 represents a portion of an integrated circuit in which the resistor is fabricated. Thus, the field plated resistor having an enhanced area over the body 38 of the resistor is available for routing other metal conductors over body 38 in the same layer of metal as forms the contacts to the resistor.

FIG. 17 is a top view of the field plated resistor of FIG. 16 showing one possible routing of conductors 90 over resistor body 38. The width 92 of the resistor body 38 is illustrated as being narrower in width than the width 94 of the first resistor contact 46 and second resistor contact 58 at ends of resistor body 38, although the invention is not limited thereto. Substantially all of the area over the resistor body 38 is available for routing traces or metal conductors, subject only to layout, design, and fabrication rules.

A field plated resistor fabricated in this manner has an enhanced area over the resistor body 38 for routing conductors or traces 90. Layout, design, and fabrication rules may be limiting factors in utilizing the area over resistor body 38 for routing conductors.

The invention may be fabricated in any known process and is easily fabricated in BICMOS (complementary bipolar) process. Not all steps of the process have been included, or not all details of all steps have been included here, but sufficient disclosure for one skilled it the art has been included. The steps disclosed are those used in a polysilicon emitter process. The polysilicon field plate resistor with enhanced area thereover for routing can be fabricated in this process without any additional processing steps. A polysilicon field plate resistor with enhanced area thereover for routing can be fabricated using less than all of the steps in the polysilicon emitter process.

Although the invention has been described as being fabricated on a silicon substrate, the invention is not limited thereto. Any semiconductor could be used. While a p-type doped region resistor has been described, the invention is not limited thereto; the invention may be used to fabricate field plated resistors of other types of dopings.

The invention claimed is:

1. A method for the manufacture of an integrated circuit having a field-plated resistor the field-plated resistor comprising:
  a. forming a resistor body in a semiconductor substrate, the resistor body having first and second contact regions,
  b. forming a first insulating layer on the resistor body, the first insulating layer approximately coextensive with the resistor body and having a top surface and a bottom surface,
  c. forming a contact window in the first insulating layer and extending from the top surface of the first insulating layer through the first insulating layer to the resistor body,
  d. forming a field plate on the first insulating layer and approximately coextensive therewith and with the resistor body, the field plate having a top surface and a bottom surface, with a portion of the bottom surface extending through the contact window in the first insulating layer and into contact with the first contact region of the resistor,
  e. depositing a second insulating layer, with a first portion of the second insulating layer at least substantially covering the field plate,
  f. depositing a metal layer, with a portion of the metal layer covering the first portion of the second insulating layer,
  g. patterning said portion of the metal layer to form
    i. an electrical contact to the top surface of the field plate, and
    ii. a plurality of metal conductors formed on the first portion of the second insulating layer.

2. The method of claim 1 wherein the field plate comprises polysilicon.

3. The method of claim 2 wherein the first and second insulating layers are $SiO_2$.

4. The method of claim 3 further including the step of forming an insulative spacer formed around the field plate.

5. The method of claim 1 wherein the electrical contact to the top surface of the field plate overlies the portion of the bottom surface of the field plate that extends through the contact window in the first insulating layer and into contact with the first contact region of the resistor.

6. The method of claim 1 wherein the said portion of the metal layer is additionally patterned to form an electrical contact to the second contact region of the resistor.

* * * * *